(12) United States Patent
Hui-Hsiung et al.

(10) Patent No.: US 8,985,807 B2
(45) Date of Patent: Mar. 24, 2015

(54) ELECTRICAL CONNECTOR AND BACKLIGHT MODULE USING THE SAME

(75) Inventors: Chen Hui-Hsiung, Hsinchu County (TW); Lai Wei-Jen, Hsinchu County (TW)

(73) Assignee: IBIS Innotech Inc., Taichung (TW)

( * ) Notice: Subject to any disclaimer, the term of this patent is extended or adjusted under 35 U.S.C. 154(b) by 351 days.

(21) Appl. No.: 13/586,287

(22) Filed: Aug. 15, 2012

(65) Prior Publication Data

US 2013/0063979 A1   Mar. 14, 2013

(30) Foreign Application Priority Data

Sep. 9, 2011   (TW) .............................. 100217017 U

(51) Int. Cl.
| | |
|---|---|
| F21S 4/00 | (2006.01) |
| F21V 7/04 | (2006.01) |
| F21V 29/00 | (2006.01) |
| F21V 13/02 | (2006.01) |
| G09F 13/04 | (2006.01) |
| H01R 33/00 | (2006.01) |
| F21V 8/00 | (2006.01) |
| H01R 12/73 | (2011.01) |
| H05K 1/02 | (2006.01) |

(52) U.S. Cl.
CPC . *F21V 7/04* (2013.01); *F21V 29/00* (2013.01); *F21V 13/02* (2013.01); *G09F 13/04* (2013.01); *H01R 12/737* (2013.01); *H05K 1/0284* (2013.01); *G02F 2201/00* (2013.01); *H01R 33/00* (2013.01); *G02B 6/0068* (2013.01); *G02B 6/0073* (2013.01); *G02B 6/0083* (2013.01)
USPC ........... 362/223; 345/173; 174/255; 362/632; 362/633

(58) Field of Classification Search
USPC ......... 362/147–149, 153, 219, 222, 223, 238, 362/240, 249.01, 249.02, 540, 543–545, 362/561, 600, 606–612, 615, 617, 621, 362/632–634; 349/57, 58, 65, 67, 149; 345/173; 174/117 FF, 255, 260
See application file for complete search history.

(56) References Cited

U.S. PATENT DOCUMENTS

| | | | | |
|---|---|---|---|---|
| 5,041,003 A | * | 8/1991 | Smith et al. | 439/259 |
| 5,903,440 A | * | 5/1999 | Blazier et al. | 361/749 |
| 5,938,455 A | * | 8/1999 | Glovatsky et al. | 439/74 |
| 6,200,146 B1 | * | 3/2001 | Sarkissian | 439/79 |
| 6,517,360 B1 | * | 2/2003 | Cohen | 439/65 |
| 6,540,558 B1 | * | 4/2003 | Paagman | 439/607.11 |
| 7,273,401 B2 | * | 9/2007 | Zaderej et al. | 439/886 |
| 7,789,674 B2 | * | 9/2010 | Nelson et al. | 439/76.1 |

* cited by examiner

*Primary Examiner* — Hargobind S Sawhney
(74) *Attorney, Agent, or Firm* — Muncy, Geissler, Olds & Lowe, P.C.

(57) ABSTRACT

The invention provides an electrical connector and a backlight module using that electrical connector. The electrical connector includes a body and two conducting lines. The body is provided with first and second connecting portions, the former of which has a first connecting surface and the latter has a second connecting surface. An invariable relative angle is defined between the first and second connecting surfaces. The conducting lines are coated on the first and second connecting surfaces without crossing each other. The backlight module includes a light guide plate, two LED light bars mounted to two respective light receiving edges of the light guide plate, and an aforesaid electrical connector connecting the LED light bars. The electrical connector is electrically connected with the LED light bars and fixes their relative positions. Besides, it is easy to install the electrical connector to connect the LED light bars firmly.

8 Claims, 6 Drawing Sheets

ELECTRICAL CONNECTOR AND BACKLIGHT MODULE USING THE SAME

BACKGROUND OF THE INVENTION

1. Field of the Invention

The present invention relates generally to backlight modules and more particularly, to an electrical connector and a backlight module using the same.

2. Description of the Related Art

A conventional backlight module comprises a light guide plate, several light-emitting diode (LED) light bars attached to several respective edges of the light guide plate, a reflection sheet attached to a bottom surface of the light guide plate, and a diffusion sheet attached to a top surface of the light guide plate. The light beams emitted from the LED light bars can go into the light guide plate through its edges at first, then go into the diffusion sheet through the top surface of the light guide plate, and finally penetrate the diffusion sheet to become a uniform surface light source which can serve as a light source of a liquid crystal display (LCD) or a billboard.

Every two adjacent light bars of the aforesaid backlight module have two conducting wires soldered therebetween for making two contacts of one of the light bars be electrically connected with two respective contacts of the other light bar and to limit the relative positions of the two light bars. However, the conducting wires cannot limit the positions of the light bars very well because of their variable shapes. Besides, soldering the conducting wires with the light bars is time-consuming and the connection therebetween is not firm enough.

SUMMARY OF THE INVENTION

The present invention has been accomplished in view of the above-noted circumstances. It is an objective of the present invention to provide an electrical connector for electrically connecting two LED light bars and fixing the relative positions of the LED light bars by the easy and time-saving way; besides, the connection of the LED light bars is effectively firm.

To attain the above objective, the present invention provides an electrical connector comprising a body and two conducting lines. The body is provided with a first connecting portion having a first connecting surface and a second connecting portion having a second connecting surface. An invariable relative angle is defined between the first and second connecting surfaces. The conducting lines are coated on the first and second connecting surfaces of the body without crossing each other for electrically connecting with two LED light bars.

The two LED light bars can be fixed to the first and second connecting portions of the electrical connector, respectively; meanwhile, two contacts of each LED light bar are electrically connected with the two conducting lines, respectively. In this way, the LED light bars are not only electrically connected with each other through the conducting lines but their relative positions are fixed by the electrical connector. Besides, each of the first and second connecting surfaces can be provided with a threaded hole and the LED light bars can be fixed to the electrical connector by two screws engaged with the threaded holes, respectively; in that event, the electrical connector further has the advantages of easy and time-saving installation method and firm connecting effect.

It is another objective of the present invention to provide a backlight module having a surface light source generated by a plurality of LED light bars and a light guide plate. Besides, it is easy and time-saving to connect the LED light bars firmly.

To attain the above objective, the present invention provides a backlight module comprising a light guide plate, an aforesaid electrical connector, and two LED light bars. The light guide plate is provided with a bottom surface, a top surface, two light receiving edges, and a juncture connected between the two light receiving edges. The electrical connector is mounted to the juncture of the light guide plate, and the first and second connecting surfaces are parallel to the two light receiving edges of the light guide plate, respectively. Each of the LED light bars has an elongated base provided with a connecting end and a plurality of LEDs mounted to the base. The connecting ends of the two LED light bars are connected with the first and second connecting portions of the electrical connector, respectively. Each of the connecting ends has two contacts touching the two conducting wires, respectively. The LEDs of the two LED light bars face the two light receiving edges of the light guide plate, respectively.

As a result, the light beams emitted from the LED light bars will go into the light guide plate through its light receiving edges and produce a surface light source going out of the top surface of the light guide plate, which can serve as a light source of a LCD or a billboard. Because the LED light bars of the backlight module are connected by aforesaid electrical connector which is applied without soldering conducting wires with the LED light bars, it is easy and time-saving to connect the LED light bars firmly.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to the skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
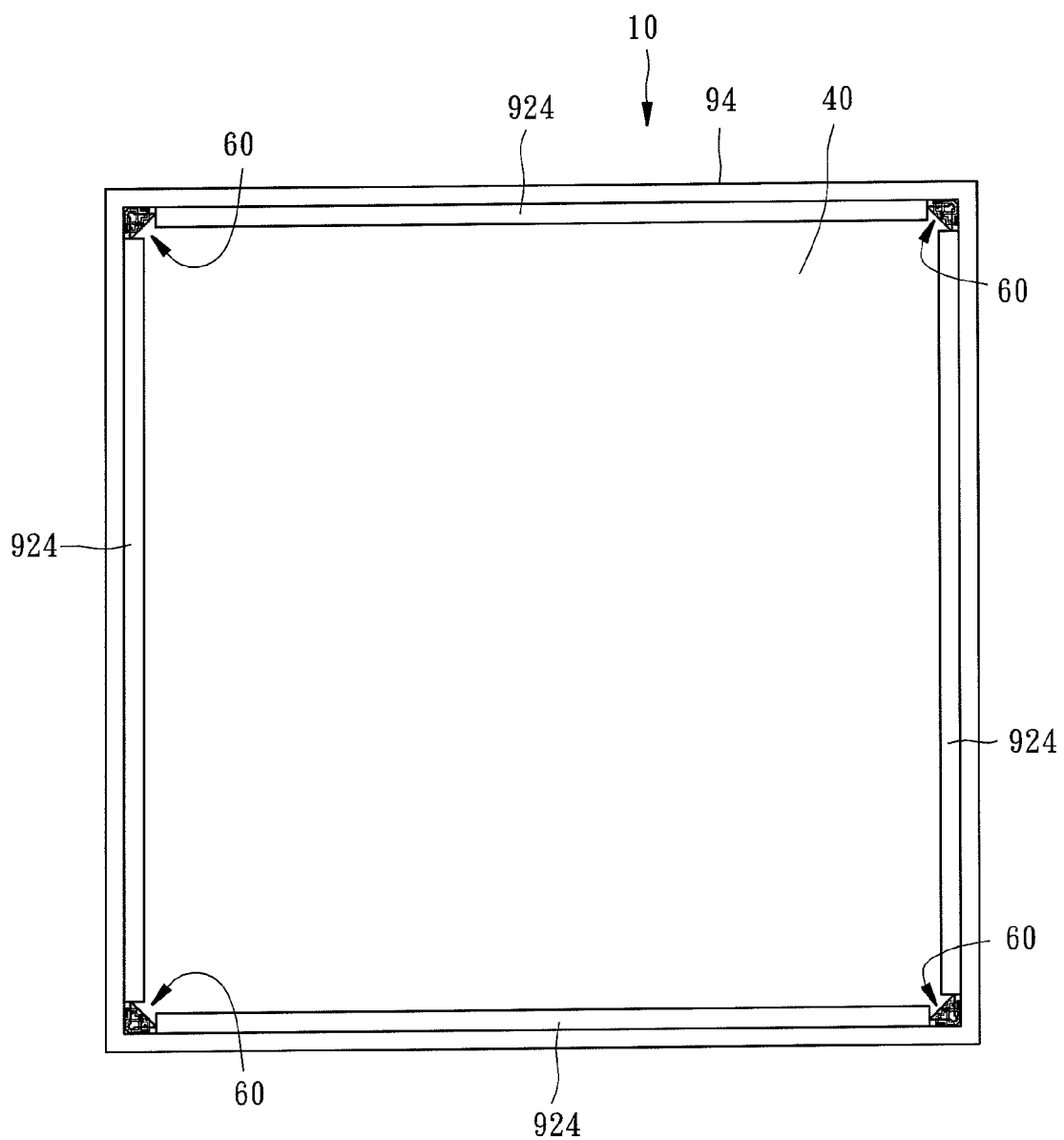
FIG. 1 is a schematic plane view of a backlight module provided by a preferred embodiment of the present invention.
Figure 2:
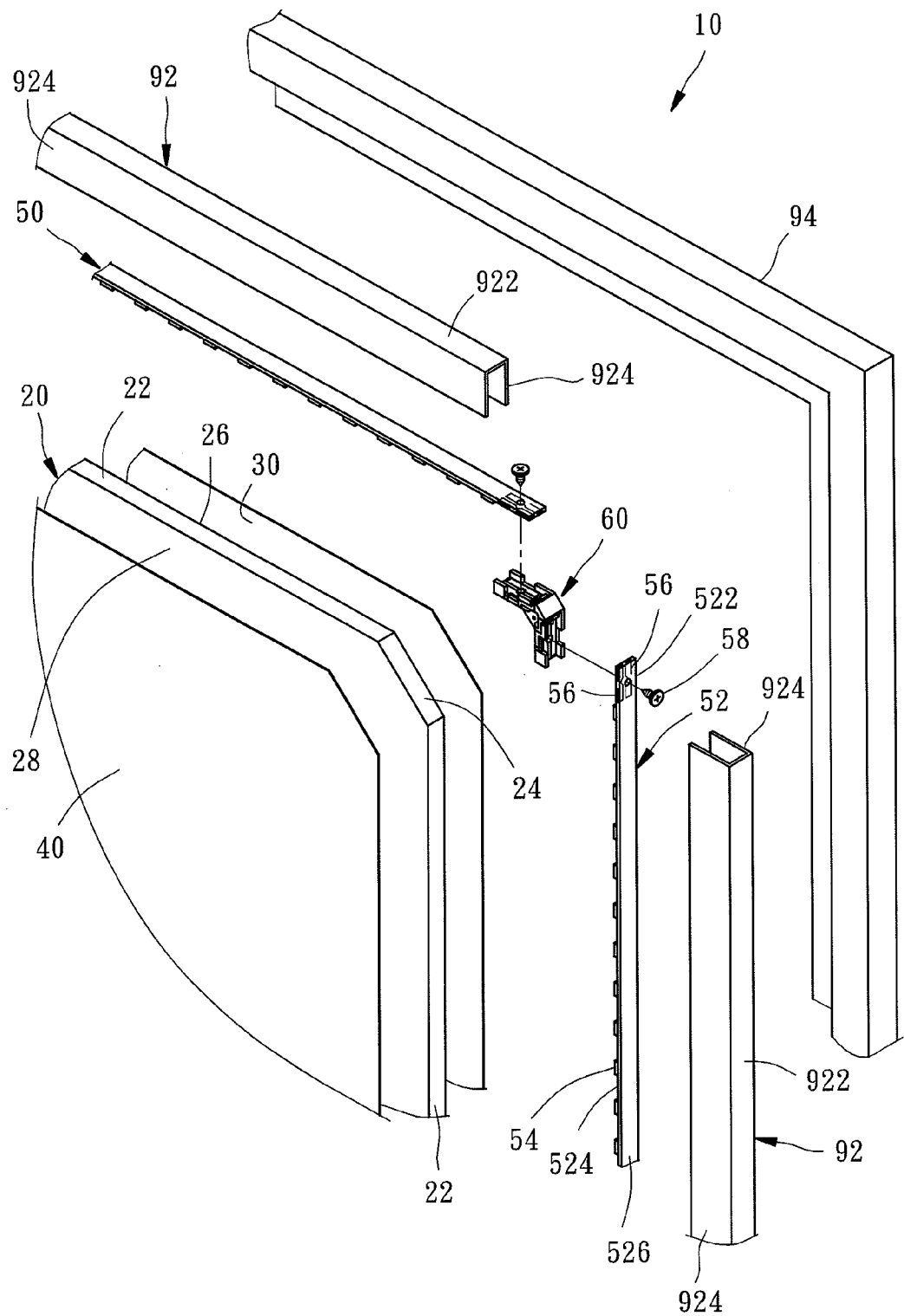
FIG. 2 is a partially exploded view of the backlight module provided by the preferred embodiment of the present invention.
Figure 3:
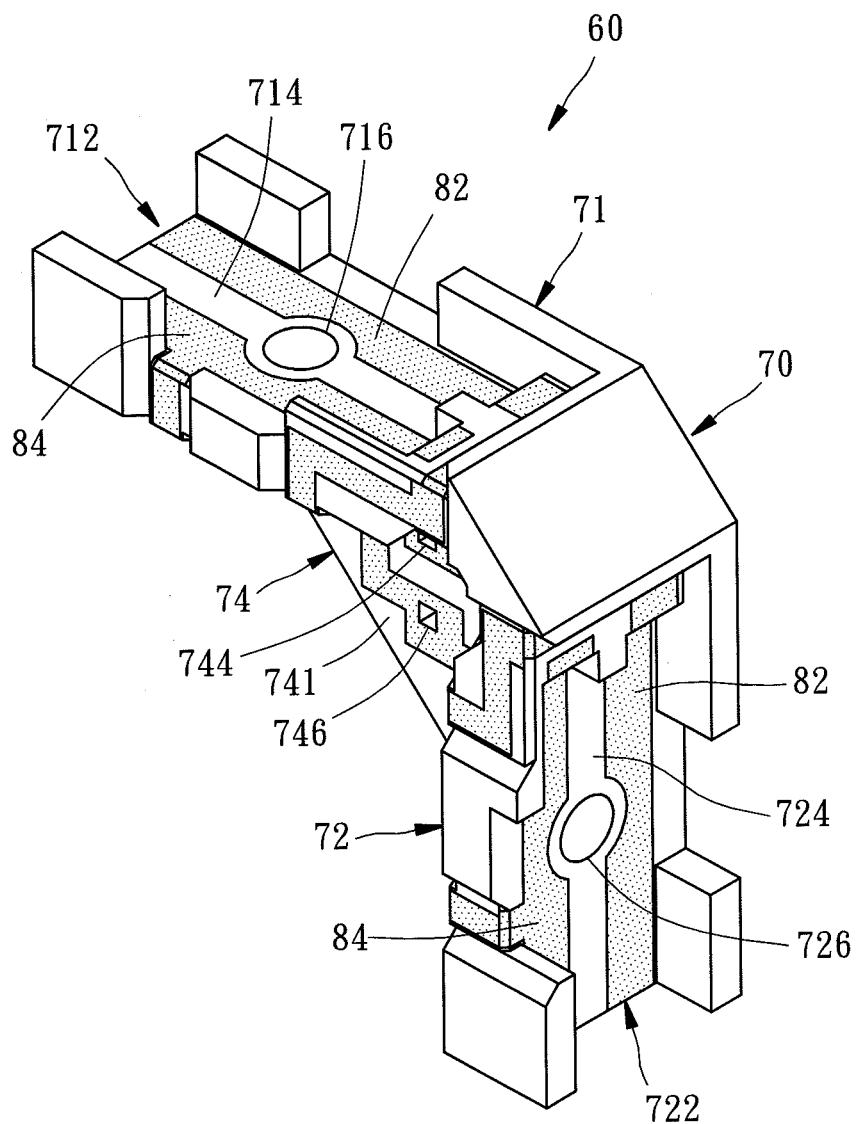
FIGS. 3-6 are perspective views of an electrical connector of the backlight module provided by the preferred embodiment of the present invention.
Figure 4:
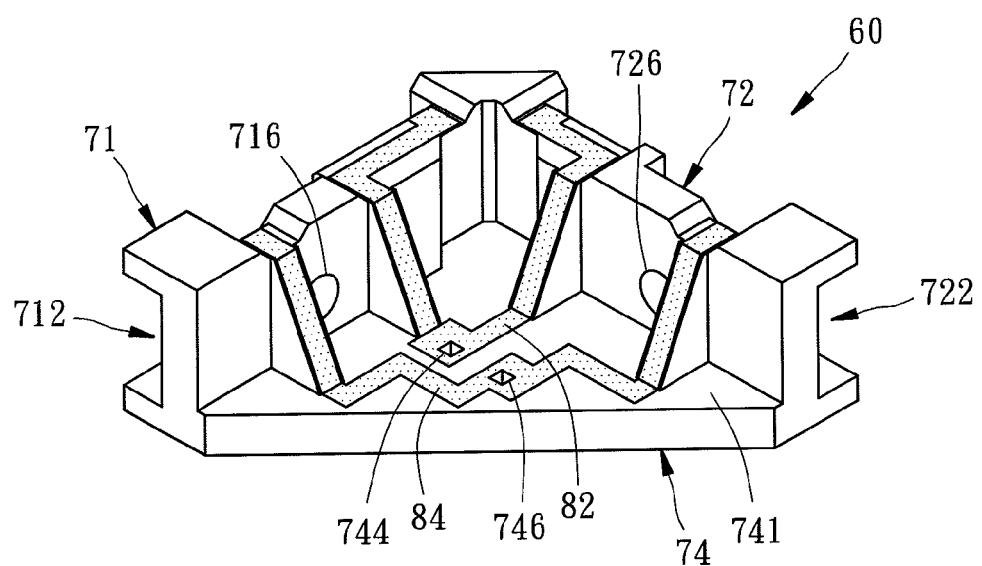
Figure 5:
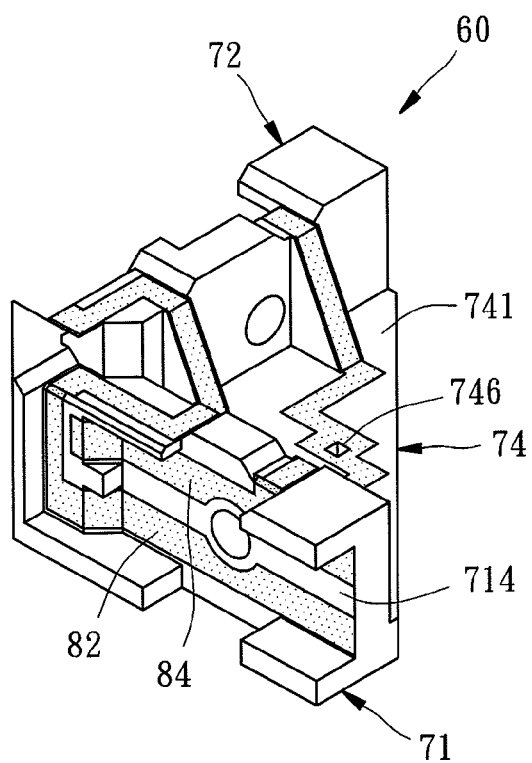
Figure 6:
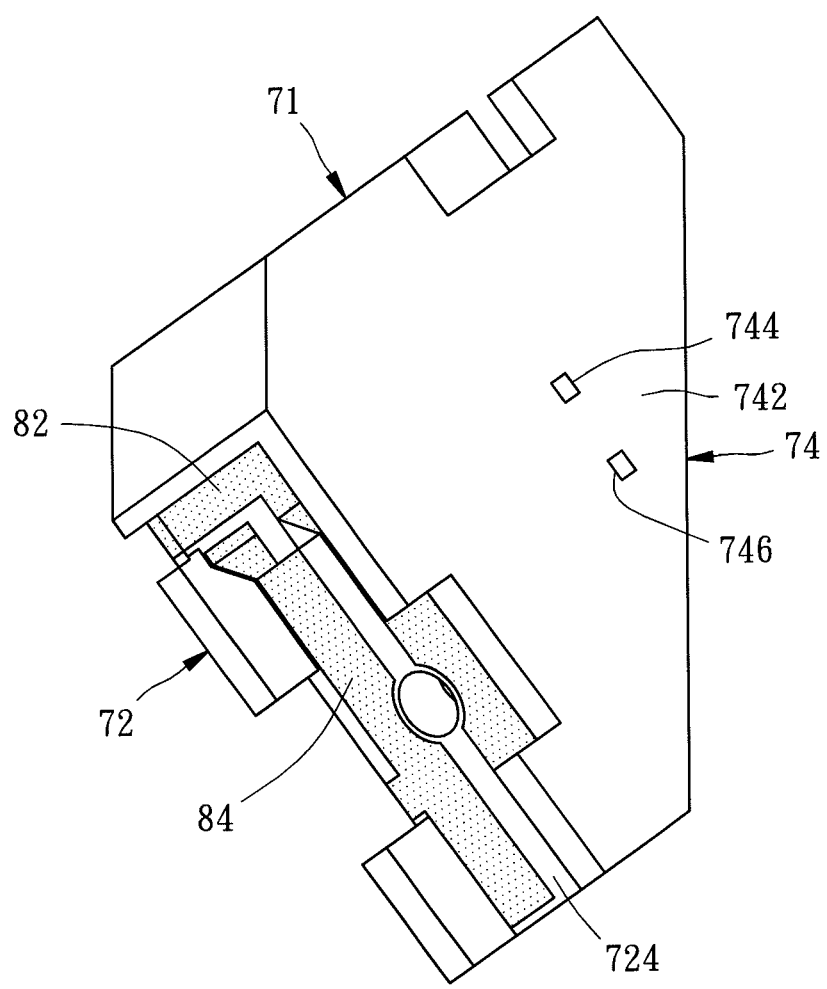

As shown in FIGS. 1-2, a backlight module 10, which is provided by a preferred embodiment of the present invention, comprises a light guide plate 20, a reflection sheet 30, a diffusion sheet 40, four LED light bars 50, and four electrical connectors 60.

The light guide plate 20 is configured as a rectangle with four bevels and provided with four planar light receiving edges 22, every two adjacent ones of which are connected with each other by a planar juncture 24. The light guide plate 20 is also provided with a bottom surface 26 and a top surface 28 whose areas are larger than the other surfaces of the light guide plate 20. The reflection sheet 30 and the diffusion sheet 40 are attached to the bottom surface 26 and the top surface 28 of the light guide plate 20, respectively.

Each of the LED light bars 50 comprises an elongated base 52 provided with two connecting ends 522, a front surface 524, a back surface 526 opposite to the front surface 524, and a plurality of LEDs 54 mounted to the front surface 524 of the base 52. Each of the connecting ends 522 has two contacts 56 located on the front surface 524 of the base 52.

Referring to FIGS. 3-6, each of the electrical connectors 60 comprises a body 70 and two conducting lines 82, 84. The body 70 is made of a specific plastic material in one piece and having some areas irradiated by laser to become conductive. The conducting lines 82, 84 are made of preferably conductive metals, such as copper, nickel or silver, and are electroplated on the conductive areas of the body 70.

The body 70 is provided with a first connecting portion 71, a second connecting portion 72, and an in-between portion 74 connected between the first and second connecting portions 71, 72. The first connecting portion 71 is provided with a recess 712, a first connecting surface 714 located in the recess 712, and a threaded hole 716. The second connecting portion 72 is provided with a recess 722, a second connecting surface 724 located in the recess 722, and a threaded hole 726. The relative angle between the first and second connecting surfaces 714, 724 is invariable. In this embodiment, the relative angle between the first and second connecting surfaces 714, 724 of each electrical connector 60 is 90 degrees for fitting the configuration of the light guide plate 20. However, the relative angle between the first and second connecting surfaces 714, 724 of the electrical connector 60 can be designed according to the configuration of the light guide plate 20, being 120 degrees as an example. The in-between portion 74 is provided with a first surface 741 and a second surface 742 opposite to the first surface 741. The relative angles between the first connecting surface 714 and the first and second surfaces 741, 742 are identical to that of the second connecting surface 724 and the first and second surfaces 741, 742 to be 90 degrees.

The conducting lines 82, 84 extend from the first connecting surface 714 to the first surface 741 and the second connecting surface 724 in order without crossing each other and passing through any of threaded holes 716, 726. The in-between portion 74 has two holes 744, 746 both passing through the first and second surfaces 741, 742 and passing through the two conducting lines 82, 84, respectively. The two holes 744, 746 are adapted for two conducting wires or pins (not shown) electrically connected with an external power source (not shown) to pass through from the second surface 742 to the first surface 741 in such a way that the two conducting wires or pins can be soldered onto the respective conducting lines 82, 84 to enable the external power source to be electrically connected with the conducting lines 82, 84. However, the holes 744, 746 can be replaced by contacts to which the conducting wires or pins can be attached. The holes 744, 746 can alternatively be located at the first or second connecting portion 71, 72; in that event, the body 70 can has none of any in-between portion 74.

Figure 7:
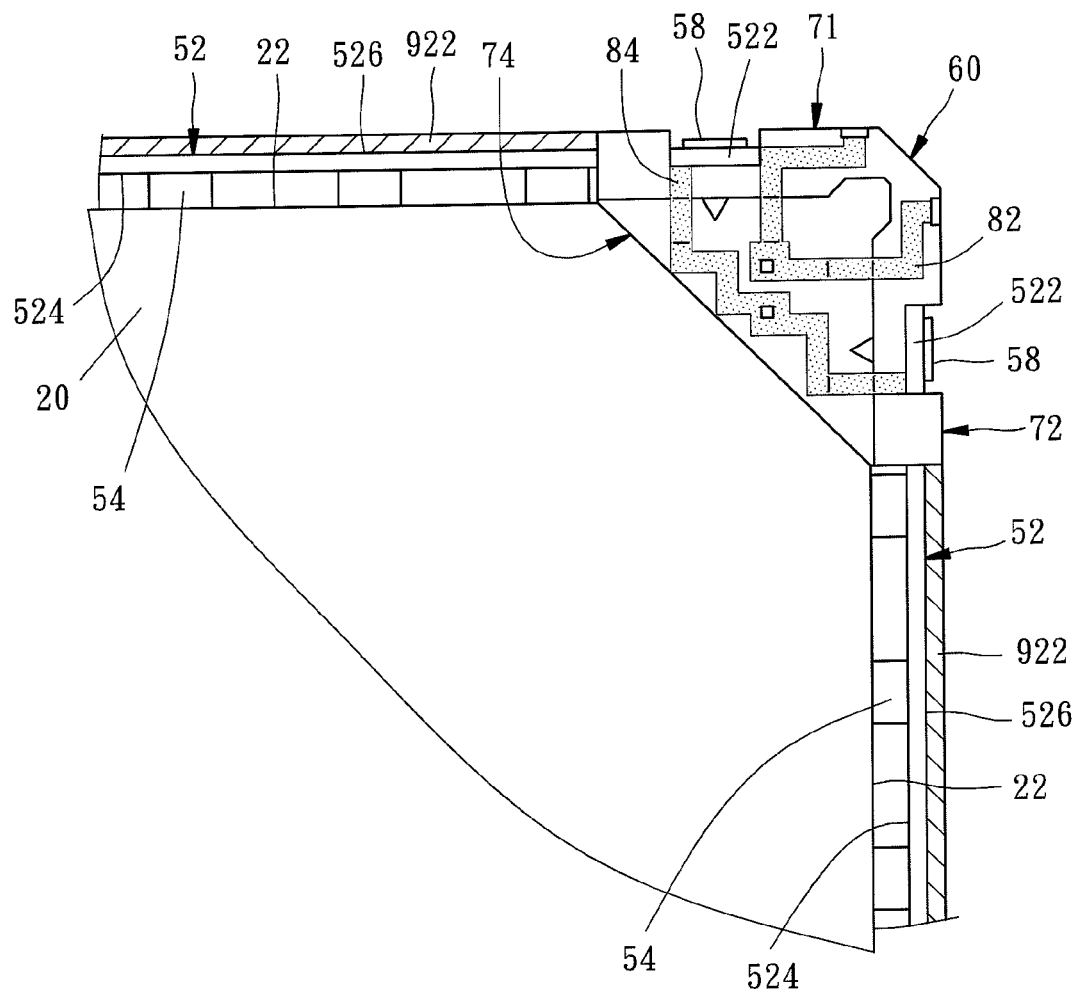
FIG. 7 is a sectional view of the backlight module provided by the preferred embodiment of the present invention.

As shown in FIGS. 1-2 and 7, the electrical connectors 60 are mounted to the respective junctures 24 of the light guide plate 20, and the first and second connecting surfaces 714, 724 of each electrical connector 60 are parallel to the two adjacent ones of the light receiving edges 22, respectively. The LED light bars 50 are mounted to the respective light receiving edges 22 of the light guide plate 20 and each of the LEDs 54 faces the corresponding light receiving edges 22.

The first connecting portion 71 of each electrical connector 60 is connected with one of the connecting ends 522 of one of the LED light bars 50, thus making the contacts 56 located on that connecting end 522 touch parts of the conducting lines 82, 84 located at that first connecting portion 71. The second connecting portion 72 of each electrical connector 60 is connected with one of the connecting ends 522 of another of the LED light bars 50, thus making the contacts 56 located on that connecting end 522 touch parts of the conducting lines 82, 84 located in that second connecting portion 72. In this embodiment, the way to achieve aforesaid connection between the two adjacent LED light bars 50 and one of the electrical connectors 60 is to enable one of the connecting ends 522 of one of the two LED light bars 50 and one of the connecting ends 522 of the other LED light bar 50 to be received in the respective recesses 712, 722 of the electrical connector 60 and then to threadably fix the connecting ends 522 of the respective LED light bars 50 to the electrical connector 60 by two screws 58 inserted through the two respective connecting ends 522 and engaged with the respective threaded holes 716, 726 of the electrical connector 60.

In this way, the relative positions of the LED light bars 50 are fixed by the electrical connectors 60; meanwhile, the LED light bars 50 and the conducting lines 82, 84 of the electrical connectors 60 are electrically connected with each other. As long as the positive and negative electrodes of the external power source are inserted through the respective holes 744, 746 of one of the electrical connectors 60 from its second surface 742 and electrically connected with the respective conducting lines 82, 84 of the same electrical connector 60, all of the LED light bars 50 can receive electricity from the external power source to glow. The light beams emitted by the LED light bars 50 can go into the light guide plate 20 through its light receiving edges 22 and then a uniform surface light can penetrate the diffusion sheet 40 to serve as the light source of an LCD or a billboard.

In aforesaid backlight module 10 provided by the invention, the electrical connectors 60 can fix the positions of the LED light bars 50 very well and it is easy and time-saving for the electrical connectors 60 to be used and connected with the LED light bars 50 firmly. Therefore, compared with the conventional backlight module, how the LED light bars 50 of the backlight module 10 of the present invention are connected is easier, firmer, and more time-saving.

The backlight module 10 can further comprise four heat-removing frame strips 92 made of materials having great heat removability, such as aluminum, and provided with a top plate 922 and two side plates 924 stretching outward from two sides of the top plate 922, respectively. The top plates 922 of the heat-removing frame strips 92 are mounted to the back surfaces 526 of the basses 52 of the LED light bars 50, respectively. The two side plates 924 of each heat-removing frame strip 92 are stretching to the reflection sheet 30 and the diffusion sheet 40, respectively. Thus, the LED light bars 50 are held between the top plates 922 of the heat-removing frame strips 92 and the light guide plate 20 and the light receiving edges 22 of the light guide plate 20 are located between the side plates 924 of the heat-removing frame strips 92. Resulting this way, the heat-removing frame strips 92 can cover the LED light bars 50 and remove the heat generated by the LED light bars 50 for preventing the LED light bars 50 from breakdowns resulting from overheating. Besides, the backlight module 10 can further comprise an external frame 94 surrounding the heat-removing frame strips 92 and the electrical connectors 60 to reinforce the structure of the backlight module 10.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrical connector for connecting two light-emitting diode (LED) light bars, comprising:
   a body provided with a first connecting portion having a first connecting surface and a second connecting portion having a second connecting surface, an invariable relative angle being defined between the first and second connecting surfaces; and
   two conducting lines coated on the first and second connecting surfaces of the body without crossing each other for electrically connecting with the two LED light bars,
   wherein the body further comprises an in-between portion connected between the first and second connecting portions and having a first surface and a second surface opposite to the first surface; the conducting lines extend from the first connecting surface to the first surface and the second connecting surface in order; the in-between portion has two holes both passing through the first and second surfaces and passing through the two conducting lines, respectively.

2. A backlight module comprising:
   a light guide plate provided with a bottom surface, a top surface, two light receiving edges, and a juncture connected between the two light receiving edges;
   an electrical connector mounted to the juncture of the light guide plate and having a body and two conducting lines, the body comprising a first connecting portion having a first connecting surface and a second connecting portion having a second connecting surface, an invariable relative angle being defined between the first and second connecting surfaces, the conducting lines being coated on the first and second connecting surfaces of the body without crossing each other, the first and second connecting surfaces being parallel to the two light receiving edges of the light guide plate, respectively; and
   two LED light bars each having an elongated base provided with a connecting end and a plurality of LEDs mounted to the base, the connecting ends of the two LED light bars being connected with the first and second connecting portions of the body, respectively; each of the connecting ends having two contacts touching the two conducting lines, respectively; the LEDs of the two LED light bars facing the two light receiving edges of the light guide plate, respectively.

3. The backlight module as claimed in claim 2, wherein each of the first and second connecting portions of the electrical connector comprises a recess; the first and second connecting surfaces are located in the recesses of the first and second connecting portions, respectively; the connecting ends of the LED light bars are located in the recesses respectively.

4. The backlight module as claimed in claim 2, wherein each of the first and second connecting portions of the electrical connector comprises a threaded hole for threadable connection with two respective screws in such a way that the connecting ends of the LED light bars are threadably fixed to the electrical connector.

5. The backlight module as claimed in claim 2, wherein the body of the electrical connector further comprises an in-between portion connected between the first and second connecting portions and having a first surface and a second surface opposite to the first surface; the conducting lines extend from the first connecting surface to the first surface and the second connecting surface in order; the in-between portion comprises two holes both passing through the first and second surfaces and passing through the two conducting lines, respectively.

6. The backlight module as claimed in claim 2 further comprising a reflection sheet mounted to the bottom surface of the light guide plate.

7. The backlight module as claimed in claim 2 further comprising a diffusion sheet mounted to the top surface of the light guide plate.

8. The backlight module as claimed in claim 2 further comprising a heat-removing frame strip provided with a top plate and two side plates stretching from two respective sides of the top plate, wherein one of the LED light bars is held between the top plate of the heat-removing frame strip and the light guide plate; one of the light receiving edges of the light guide plate is located between the two side plates.

* * * * *